(12) United States Patent
Crosby et al.

(10) Patent No.: US 7,492,181 B1
(45) Date of Patent: Feb. 17, 2009

(54) METHOD AND DEVICE FOR ENABLING THE MEASUREMENT OF DEVICE UNDER TEST VOLTAGES USING A TESTING INSTRUMENT OF LIMITED RANGE

(75) Inventors: Laurence Crosby, Fremont, CA (US); John M. Oonk, San Ramon, CA (US)

(73) Assignee: Credence Systems Corporation, Milpitas, CA (US)

( * ) Notice: Subject to any disclaimer, the term of this patent is extended or adjusted under 35 U.S.C. 154(b) by 187 days.

(21) Appl. No.: 11/445,056

(22) Filed: May 31, 2006

(51) Int. Cl.
*G01R 31/26* (2006.01)
*G01R 31/28* (2006.01)

(52) U.S. Cl. .................... 324/765; 324/158.1

(58) Field of Classification Search .......... 324/763, 324/765, 158.1, 73.5; 702/64, 1, 57; 714/736, 714/734, 724; 327/108, 100, 407; 379/22, 379/22.02, 1.01

See application file for complete search history.

(56) References Cited

U.S. PATENT DOCUMENTS

| 6,255,842 B1 * | 7/2001 | Hashimoto | 324/765 |
| 7,109,736 B2 * | 9/2006 | Long | 324/765 |
| 7,256,600 B2 * | 8/2007 | Walker et al. | 324/763 |

\* cited by examiner

*Primary Examiner*—Ha Tran T Nguyen
*Assistant Examiner*—Tung X Nguyen

(57) ABSTRACT

A method for determining an output voltage of a device under test is disclosed. In the method, a first voltage is placed onto a terminal of a resister that is coupled to the device under test and a first current is through the resistor that corresponds to the first voltage is measured. A second voltage is then placed onto the terminal of the resistor and a second current is measured through the resistor that corresponds to the second voltage. An actual resistance of the resistor is computed based on the difference between the first voltage and the second voltage divided by the difference between the first current and the second current. An output voltage of the device under test is calculated based on a magnitude of a measured current through the resistor when the terminal is grounded multiplied by a magnitude of the actual resistance of the resistor.

16 Claims, 6 Drawing Sheets

METHOD AND DEVICE FOR ENABLING THE MEASUREMENT OF DEVICE UNDER TEST VOLTAGES USING A TESTING INSTRUMENT OF LIMITED RANGE

TECHNICAL FIELD

Embodiments of the present invention pertain to methods and devices that enable the measurement of device under test (DUT) voltages using a testing instrument of limited range.

BACKGROUND ART

Conventional testing systems that measure device under test (DUT) voltages are used to determine if a DUT or a component thereof is operating properly. One such type of testing system is automated testing equipment (ATE) instrumentation. ATE instrumentation can include precision measurement units (PMUs) that are used to measure currents and voltages that are received or are output by DUTs. Some DUTs generate voltages that may exceed the voltage measurement range of conventional ATE PMU instruments. However, this causes problems as ATE PMU instruments cannot measure voltages from DUTs that exceed the measurement range of the PMU.

It should be appreciated that some conventional testing systems can only test voltage signals whose magnitudes fall below 15 volts for instance. However, increasingly, the testing of voltage signals of 30 volts or more can be required.

Test fixtures can be used to accommodate the performance of test operations in various types of test environments. Such test fixtures can be employed to provide an interface between test instrumentation, the DUT and the test operator. Some conventional test fixtures have been developed that include components that enable ATE PMUs to measure voltages that exceed their normal voltage range.

FIG. 1A shows a conventional circuit arrangement 100 that can be included as a part of a test fixture 109 that is used as an interface between a DUT 101 and a PMU 107 to enable the determination of DUT 101 output voltages that exceed the voltage measuring capacity of PMU 107. Shown in FIG. 1A are DUT 101, resistor1 103, resistor2 105 and PMU 107. Referring to FIG. 1A, resistor1 103 and resistor2 105 are connected in a typical voltage divider arrangement. This arrangement allows a voltage that is smaller than that which is located at the output of DUT 101 to be supplied as a reference to PMU 107. In this manner a voltage that lies within the voltage measuring range of PMU 107 can be supplied to PMU 107 from which the output voltage of DUT 101 can be computed.

The circuit shown in FIG. 1A has serious shortcomings. For example, because the system relies upon knowledge of the precise size of resistor1 103 and resistor2 105 as a means of accurately computing DUT 101 output voltages, resistors that have small tolerances should be used. This can present significant challenges because resistors in the mega ohm and giga ohm range can be necessary to generate sufficiently high voltages from the low power pins of typical DUTs. The actual resistance of such large resistors can vary widely, for instance a one mega ohm resistor with a tolerance of ten percent can have an actual resistance that is 100 kilo ohms more or less than the indicated value. Because of such lack of precision the accuracy of the voltage computations that are based on the listed resistance of such resistors can suffer greatly. Moreover, because the correct value of the resistor is relied upon, diagnostics and calibration to assure the resistor value is correct can be needed. In addition, these large resistors are expensive, hard to procure and are difficult to match (e.g., tolerances).

An additional shortcoming of the system shown in FIG. 1A is that the system draws current from DUT 101. Such draws of current can be detrimental to the operation of DUT 101 and can impact the accuracy of the measurement.

FIG. 1B shows another conventional circuit arrangement 100 that can be used as a part of a test fixture 113 that is used as an interface between a DUT 101 and a PMU 107 to enable the determination of DUT 101 output voltages that exceed the voltage measuring capacity of PMU 107. FIG. 1B shows in addition to the structures enumerated above with reference to FIG. 1A, buffer 111 (e.g., operational amplifier etc.) and test fixture 113. In the system shown in FIG. 1B, the draw of current from DUT 101 is obviated as current is supplied by buffer 111. However, a significant drawback of this system is that buffer 101 has to be powered with supply rails that have a voltage magnitude that is greater than the magnitude of the output voltage of DUT 107 in order to sense the output voltage of DUT 101. It should be appreciated that providing a rail that has such magnitude can present difficult design challenges especially in high voltage output ranges. Providing voltages, such as 25 volts or more, to the rails can be complex and costly.

In general, conventional approaches to measuring voltages that exceed the measuring range of testing systems can be expensive, place undesirable loads on the DUT or involve design challenges. Such approaches can be undesirable for many DUT testing applications.

SUMMARY OF THE INVENTION

Accordingly, a need exists for an effective mechanism of determining an output voltage of a device under test that is being tested by a testing system where the output voltage of the device under test exceeds the voltage measurement range of the testing system. The present invention provides a method that accomplishes this need.

In one embodiment, an output voltage of a device under test that exceeds the measurement range of a testing system is determined by the testing system. In this embodiment, current measurements taken at different voltages allow a computation of a device under test output voltage where the voltage may exceed the measurement range of the testing system. Because the output voltage is determined from calculations based on current measurements (small in magnitude), the voltage measurement range limitations of the testing system does not prevent the determination of output voltages that exceed the measurement range of the utilized testing system. Additionally, due to the computations involved, the values of the components used are computed in real-time and therefore precision components are not required.

As a part of the disclosed method a first voltage is placed onto a terminal of a resister that is coupled to the device under test and a first current through the resistor that corresponds to the first voltage is measured. A second voltage is then placed onto the terminal of the resistor and a second current through the resistor is measured that corresponds to the second voltage. An actual resistance of the resistor is computed based on the difference between the first voltage and the second voltage divided by the difference between the first current and the second current. Therefore, precision resistors are not required. An output voltage of the device under test is then calculated based on a magnitude of a measured current through the resistor when the aforementioned terminal is grounded multiplied by a magnitude of the actual resistance of the resistor, e.g., voltage equals current times resistance.

In one embodiment, an implementation for dies is disclosed. This embodiment includes a probe board test fixture that includes one or more resistors (one for each port tested) that enable the measurement of die voltages that exceed the voltage measurement range of utilized testing instrumentation. The probe board can be put into place over the die to facilitate the taking of measurements from the die.

In another embodiment, an implementation for packages is disclosed. This embodiment includes an adapter board test fixture that includes one or mores resistors (one for each pin) that enable the measurement of package voltages that exceed the voltage measuring range of testing instrumentation. The adapter board can accommodate a socket in which a package can be placed in order to facilitate the taking of measurements from package pins.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
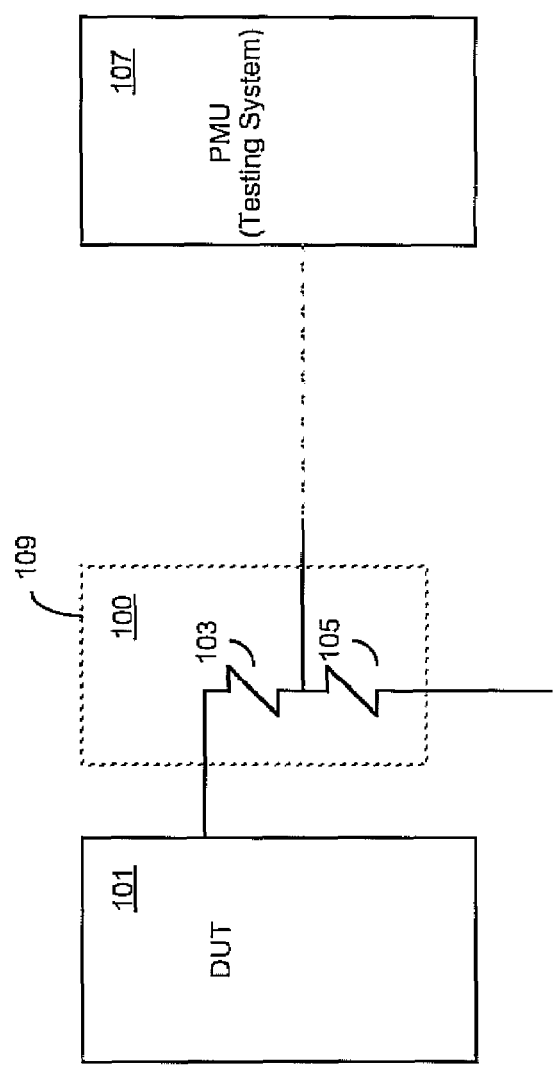
FIG. 1A shows a conventional circuit arrangement that can be used as a part of a test fixture that is used as an interface between a device under test (DUT) and a precision measurement unit (PMU) to enable the determination of DUT output voltages that exceed the voltage measuring range of the PMU.
Figure 1B:
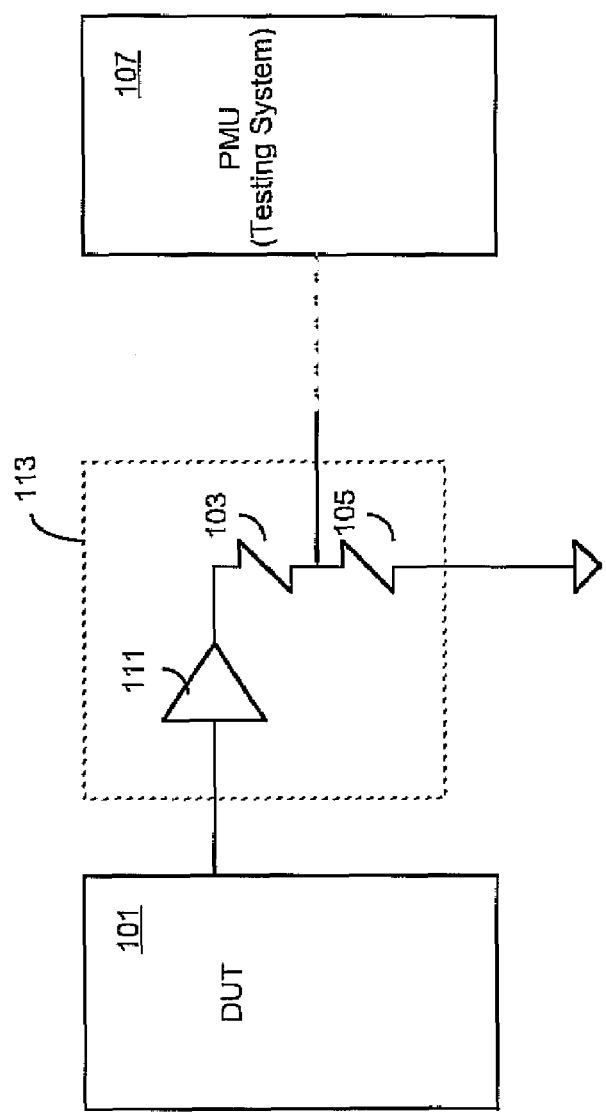
FIG. 1B shows another conventional circuit arrangement that can be used as a part of a test fixture that is used as an interface between a DUT and a PMU to enable the determination of DUT output voltages that exceed the voltage measuring range of the PMU.
Figure 2A:
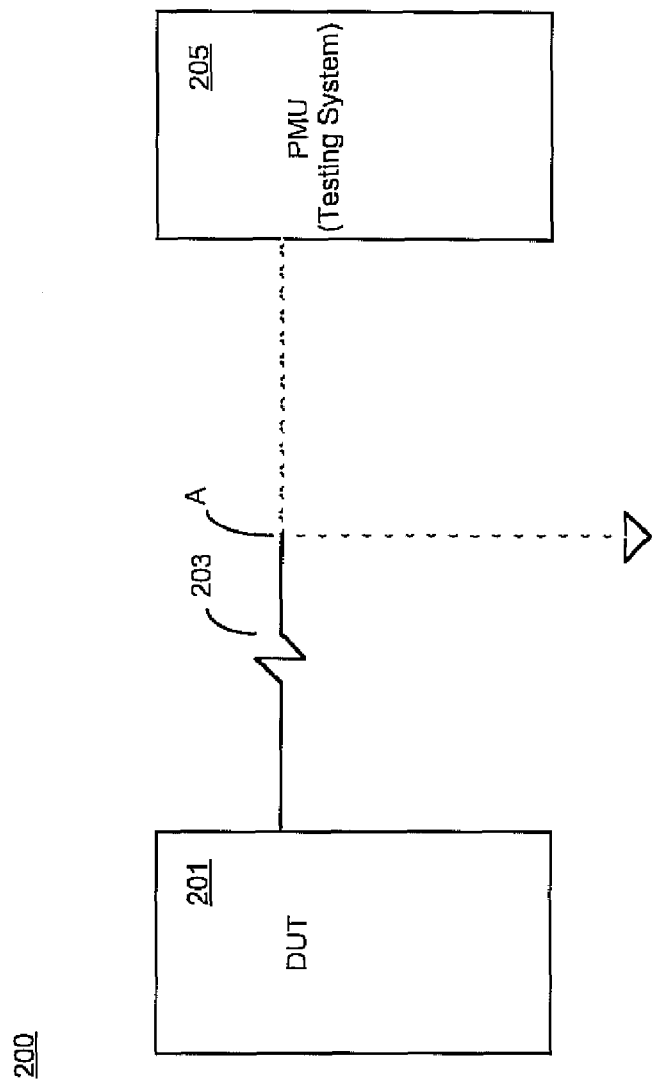
FIG. 2A shows a system for enabling the measurement of voltages that exceed the voltage measuring range of testing instrumentation according to one embodiment of the present invention.

Device for Enabling the Measurement of DUT Voltages that Exceed the Voltage Measuring Range of Testing Instrumentation According to One Embodiment of the Present Invention FIG. 2A shows an automated device testing platform 200 that accommodates the use of a device that enables the measurement of device under test (DUT) voltages that exceed the voltage measuring range of utilized testing instrumentation according to one embodiment of the present invention. In one embodiment, platform 200 accommodates the use of a device that enables the measurement of voltages that exceed a specified voltage range of testing system 205. FIG. 2A shows DUT 201, resistor 203 and testing system 205.

Referring to FIG. 2A, DUT 201 is a device that undergoes testing by testing system 205. In one embodiment, the voltage output of one or more desired ports of DUT 201 can be measured during a device testing session. DUT 201 can include but is not limited to a circuit board, flash memory, gates etc.

Testing system 205 is coupled to DUT 201 during device testing through resistor 203. In one embodiment, the voltage output of DUT can exceed the voltage measurement range of testing system 205. In one embodiment, testing system 205 can include an ATE that includes a PMU. In other embodiments, other type testing systems can be used. In one embodiment, testing system 205 can use a force and measure process in the computation of a DUT 201 output voltage as described in detail herein.

For example in one embodiment, initially, testing system 205 places a voltage V1 of a first magnitude onto the terminal of resistor 203 (see terminal A in FIG. 2A), that is adjacent to and coupled to testing system 205, in order to cause the flow of a current I1 of a first magnitude through resistor 203. System 205 includes a current meter and therefore measures current I1. Subsequently, testing system 205 places a voltage V2 of a second magnitude onto the terminal of resistor 203, that is adjacent to and coupled to testing system 205, in order to cause the flow of a current I2 of a second magnitude through resistor 203. This current is also measured. The current that is caused to flow through resistor 203 when the first and second voltages are placed onto the terminal of resistor 203 (e.g., I2 and I2) are individually measured in order to determine their magnitude. The value of R in one embodiment can be from 25 to 100 mega ohms and resistor 203 can be a low precision component.

The value R of resistor 203 can then be calculated using the equation:

$$R = \Delta V / \Delta I \quad (1)$$

where $\Delta V = V2 - V1$ and $\Delta I = I2 - I1$

Since the resistance is measured, precision components need not be used. In one embodiment, the magnitude of the output voltage Vout of DUT 201 can then be calculated using the value of R determined using equation (1). Specifically, Vout can be determined using the following equation:

$$Vout = Imeasured \times R \quad (2)$$

where Imeasured is the measured value of the current through R at 0 volts at A. It is appreciated that A can be grounded or placed at any known voltage.

It should be appreciated that resistor 203 is used to establish the current that corresponds to the voltages that are forced onto terminal A (see FIG. 2A) by testing system 205. In one embodiment, terminal A of resistor 203 can serve as an output terminal for the current that corresponds to voltages forced by testing system 205.

It should be appreciated that because the determination of Vout is based on computations that rely on current measurements (and voltages system 205 is capable of forcing) the voltage measurement range limitations of testing system 205 do not limit the size of Vout that can be computed. Moreover, the voltage measurements can be obtained with a minimal amount of current draw from DUT 201 (since R can be very large), an absence of complicated rail design and without the necessity of calibrations or expensive precision parts.

In one embodiment, DUT 201 can be contained on a die or can be contained in a package. In one embodiment, the first voltage that is placed on terminal A is ground. In an alternate embodiment, the first voltage that is placed on terminal A is other than ground. In exemplary embodiments, output voltage Vout can be greater than 15 volts. In one embodiment, DUT 201 can be a NAND type flash memory with bias pins that are used for programming. In one embodiment, the value of R can be 25-100 mega ohms low tolerance. In other embodiments, other values of R can be used.

Figure 2B:
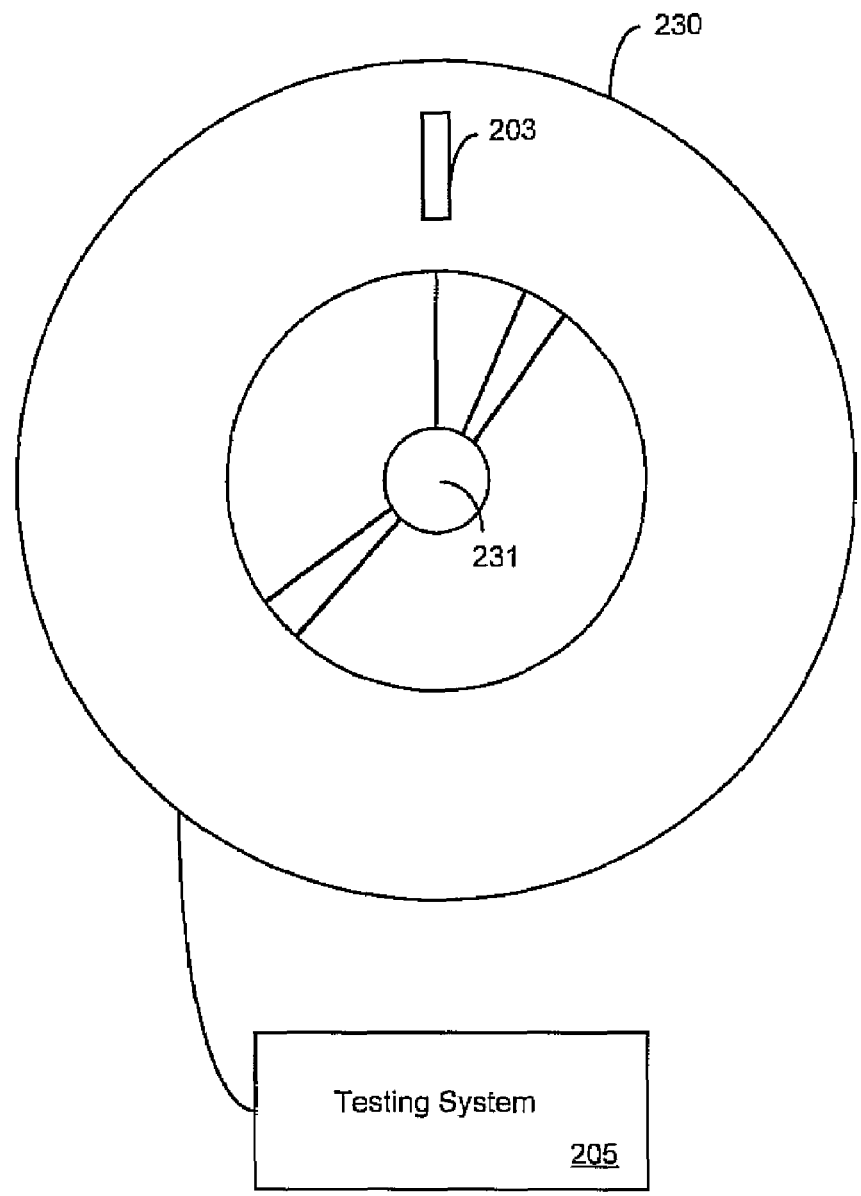
FIG. 2B shows an implementation for dies according to one embodiment of the present invention.

FIG. 2B shows an implementation for dies according to one embodiment of the present invention. FIG. 2B shows a probe board 230 test fixture that includes a resistor 203 for enabling the measurement of die 231 voltages that exceed the voltage measuring range of testing instrumentation (e.g., 205). Referring to FIG. 2B, probe board 230 includes one or more a resistors 203 (one for each port tested) for enabling the measurement of DUT 201 voltages that exceed the voltage measuring range of testing system 205. The probe board 230 can be put into place over die 231 to facilitate measurements.

Figure 2C:
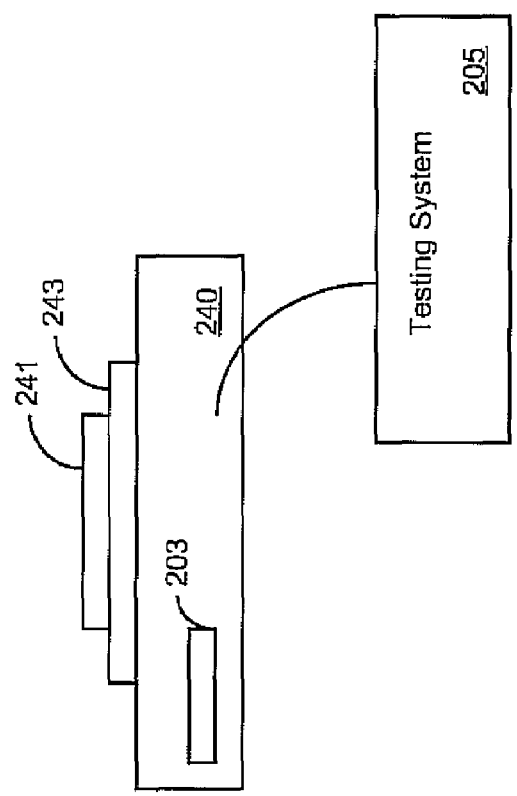
FIG. 2C shows an implementation for packages according to one embodiment of the present invention.

FIG. 2C shows an implementation for packages 241 according to one embodiment of the present invention. FIG. 2C shows an adapter board 240 test fixture that includes a resistor 203 for enabling the measurement of package 201 voltages that exceed the voltage measuring range of testing instrumentation (e.g., 205). Referring to FIG. 2C, adapter board 240 can include one or more resistors 203 (one for each pin of package tested) for enabling the measurement of package 241 voltages that exceed the voltage measuring range of testing system 205. The adapter board 240 can include a socket 243 in which a package or packages 241 can be placed in order to facilitate measurements.

Exemplary Operations in Accordance with Embodiments of the Present Invention

Figure 3:
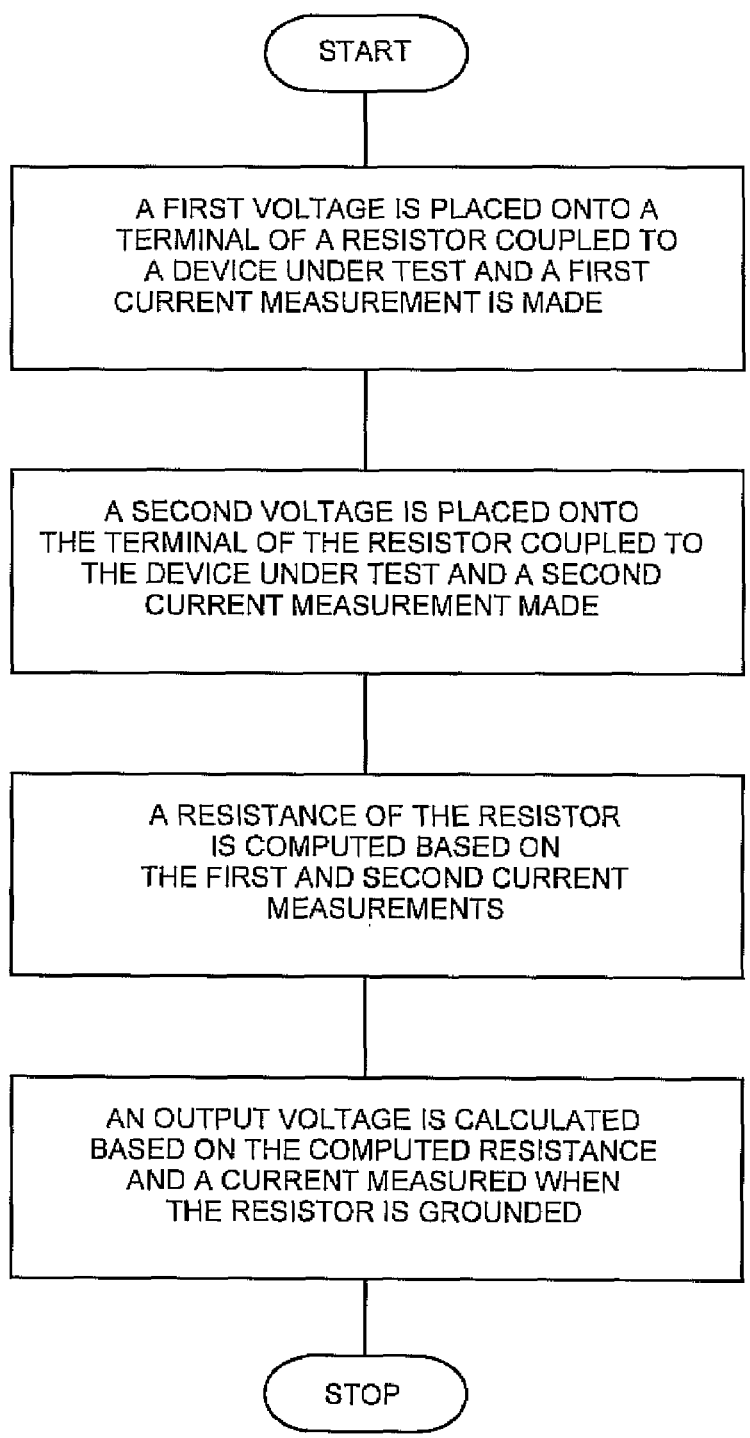
FIG. 3 shows a flowchart of steps in a method for enabling the measurement of voltages that exceed the voltage measuring range of testing instrumentation according to one embodiment of the present invention.

FIG. 3 shows a flowchart of steps in a method 300 for determining the voltage of a device under test (DUT) according to one embodiment of the present invention. It should be appreciated that although specific steps are disclosed in the flowchart, such steps are exemplary. That is, the present invention is well suited to performing various other steps or variations of the steps recited in FIG. 3.

Referring to FIG. 3, at step 301, a first voltage is placed onto a terminal of a resister (e.g., 203 in FIG. 2A) coupled to a device under test (DUT). The first voltage causes a first current to flow through the resistor which is measured. In one embodiment, the terminal onto which the first voltage is placed is the resistor terminal that is adjacent a DUT testing system. In one embodiment, the first voltage can have a magnitude of zero volts (e.g., ground). In another embodiment, the first voltage can have another magnitude.

At step 303, a second voltage is placed onto the terminal of the resistor that is coupled to the device under test (DUT). The second voltage causes a second current to flow through the resistor which is measured. In one embodiment, the second voltage that is placed onto the aforementioned terminal of the resistor is a voltage that is different from the first voltage that is placed onto the aforementioned terminal of the resistor. In one embodiment, the measurement of respective currents at respective voltages enables the computation of the DUT output voltage.

A step 305, a resistance R of the resistor is computed where R is equal to the difference between the first voltage and the second voltage divided by the difference between the first current and said second current. As discussed above, the value R of the resistor can be calculated using the equation:

$$R = \Delta V / \Delta I \qquad (1)$$

where $\Delta V = V2 - V1$ and $\Delta I = I2 - I1$

At step 307, an output voltage Vout is calculated where Vout is equal to the measured current through the resistor multiplied by the computed resistance of the resistor. As discussed above, in one embodiment, the magnitude of the output voltage (e.g., Vout of DUT 201 in FIG. 2A) can be calculated using the value of R determined using equation (1). Specifically, Vout can be determined using the following equation:

$$Vout = Imeasured \times R \qquad (2)$$

where Imeasured is equal to the current flowing through the resistor when the aforementioned terminal is grounded or otherwise set to a known voltage.

It should be appreciated that, as previously discussed, because the determination of Vout is based on computations that rely on current measurements (and voltages that system 205 is capable of forcing) the voltage measurement range limitations of testing system 205 do not limit the size of Vout that can be computed.

In accordance with exemplary embodiments thereof, a method for determining an output voltage of a device under test is disclosed. In the method, a first voltage is placed onto a terminal of a resister that is coupled to the device under test and a first current is through the resistor that corresponds to the first voltage is measured. A second voltage is then placed onto the terminal of the resistor and a second current through the resistor is measured that corresponds to the second voltage. An actual resistance of the resistor is computed based on the difference between the first voltage and the second voltage divided by the difference between the first current and the second current. An output voltage of the device under test is calculated based on a magnitude of a measured current through the resistor when the terminal is grounded multiplied by a magnitude of the actual resistance of the resistor.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for determining an output voltage of a device under test, comprising:
    placing a first voltage onto a terminal of a resistor coupled to said device under test and measuring a first current through said resistor;
    placing a second voltage onto said terminal of said resistor and measuring a second current through said resistor;
    computing an actual resistance of said resistor based on the difference between said first voltage and said second voltage divided by the difference between said first current and said second current; and
    calculating an output voltage of said device under test as a magnitude of a measured current through said resistor when said terminal is placed at a known voltage multiplied by said actual resistance of said resistor.

2. The method of claim 1 wherein said resistor is coupled between said device under test and a testing device and is a high resistance, low tolerance component.

3. The method of claim 1 wherein said first voltage and said second voltage are different.

4. The method of claim 1 wherein said placing is performed by an automated testing system.

5. The method of claim 1 wherein said device under test is contained on one of a die and a package.

6. The method of claim 1 wherein said known voltage is ground.

7. The method of claim 1 wherein said output voltage is greater than 15 volts.

8. The method of claim 1 wherein said device under test is a NAND type flash memory.

9. In an automated testing system for testing an output of a device under test, a method for determining the voltage of a device under test, comprising:
    placing a first voltage onto a terminal of a resistor and measuring a first current through said resistor that corresponds to said first voltage wherein said resistor is coupled to said output;
    placing a second voltage onto said terminal of said resistor and measuring a second current through said resistor that corresponds to said second voltage;
    computing an actual resistance of said resistor based on the difference between said first voltage and said second voltage divided by the difference between said first current and said second current; and
    calculating an output voltage of said output of said device under test as a magnitude of a measured current through said resistor when said terminal is held at a known voltage multiplied by a magnitude of said actual resistance of said resistor.

10. The system of claim 9 wherein said resistor is coupled between said device under test and a testing device.

11. The system of claim 9 wherein said first voltage and said second voltage are different.

12. The system of claim 9 wherein said placing is performed by an automated testing system.

13. The system of claim 9 wherein said device under test is contained on one of a die and a package.

14. The system of claim 9 wherein said first voltage that is placed on said terminal is ground.

15. The system of claim 9 wherein said output voltage is greater than 15 volts.

16. The system of claim 9 wherein said device under test is NAND type flash memory.

* * * * *